United States Patent
Dietz et al.

(10) Patent No.: US 10,955,501 B2
(45) Date of Patent: Mar. 23, 2021

(54) MONITORING AN MR MAGNET USING VIBRATIONS

(71) Applicant: Siemens Healthcare GmbH, Erlangen (DE)

(72) Inventors: Peter Dietz, Fuerth (DE); Andreas Krug, Fuerth (DE); Christopher Stroehlein, Nuremberg (DE); Karsten Wicklow, Bamberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/675,451

(22) Filed: Nov. 6, 2019

(65) Prior Publication Data
US 2020/0142015 A1    May 7, 2020

(30) Foreign Application Priority Data
Nov. 6, 2018    (EP) .................................... 18204577

(51) Int. Cl.
*G01R 33/54*        (2006.01)
*G01R 33/3815*    (2006.01)
*G01R 33/385*      (2006.01)

(52) U.S. Cl.
CPC ......... *G01R 33/543* (2013.01); *G01R 33/385* (2013.01); *G01R 33/3815* (2013.01)

(58) Field of Classification Search
CPC . G01R 33/543; G01R 33/3815; G01R 33/385
See application file for complete search history.

(56) References Cited

U.S. PATENT DOCUMENTS

| 2004/0032260 A1 | 2/2004 | Fontius et al. | |
| 2005/0285596 A1* | 12/2005 | Suzuki | G01R 33/3854 324/318 |
| 2007/0182516 A1 | 8/2007 | Roozen et al. | |
| 2009/0044212 A1* | 2/2009 | Dietz | G01R 33/3854 720/651 |

(Continued)

FOREIGN PATENT DOCUMENTS

| DE | 102010041146 A1 | 3/2012 | |
| JP | 2001095781 A * | 4/2001 | G01R 33/3854 |

OTHER PUBLICATIONS

Hua, Yihe et al. "Gradient Coil Induced Joule Heating in a MRI Magnet" International Society for Magnetic Resonance in Medicine, Proceedings of ISMRM, Abstract #2580, 2012.

(Continued)

*Primary Examiner* — G. M. A Hyder
(74) *Attorney, Agent, or Firm* — Schiff Hardin LLP

(57) ABSTRACT

A magnetic resonance system includes a magnet device, which is arranged in an outer housing and an inner housing located therein. A monitoring method includes determining a value of a vibration amplitude of the outer housing or an intermediate housing located between the inner housing and the outer housing at a vibration frequency; providing a transmission ratio between the vibration amplitude and the operating parameter at the vibration frequency; and determining a value of the operating parameter as a function of the determined value of the vibration amplitude by means of the transmission ratio.

15 Claims, 6 Drawing Sheets

(56) References Cited

U.S. PATENT DOCUMENTS

2015/0241540 A1\* 8/2015 Vernickel ......... G01R 33/56375
324/309
2015/0369888 A1 12/2015 Calvert

OTHER PUBLICATIONS

Jiang, Longzhi et al. "Experimental Investigations on Gradient Coil Induced Magnet Heating in MRI System" International Society for Magnetic Resonance in Medicine, Proceedings of ISMRM, Abstract #4846, 2014.

\* cited by examiner

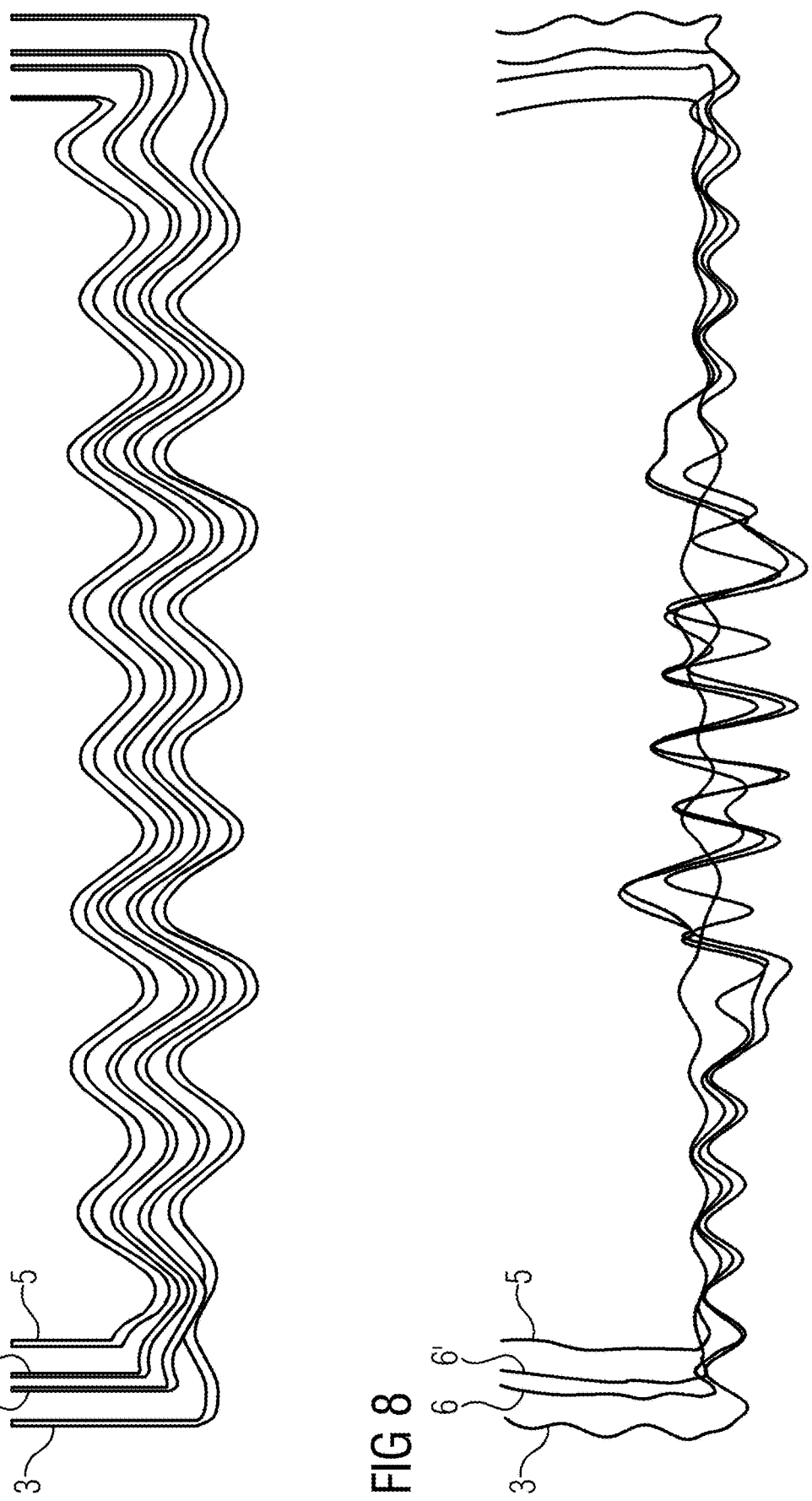

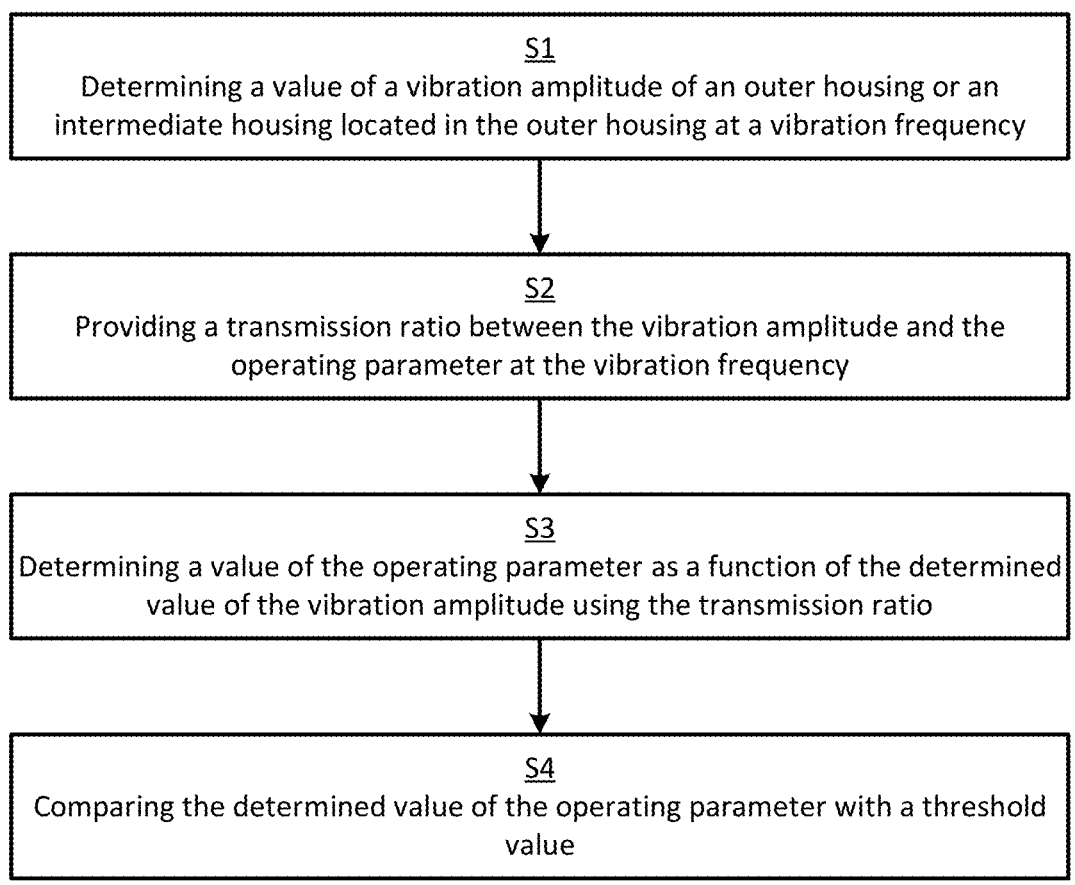

MONITORING AN MR MAGNET USING VIBRATIONS

BACKGROUND

The present disclosure relates to a method for monitoring an operating parameter for a magnet device of a magnetic resonance system, wherein the magnet device is located in an outer housing and an inner housing located therein. In addition, the present disclosure relates to a magnetic resonance system having an outer housing, an inner housing inside the outer housing, a magnet device inside the inner housing and a gradient coil outside of the outer housing.

In magnetic resonance systems, a measuring object is exposed to a strong, constant magnetic field (basic magnetic field) in order to orient the nuclear spins of the atoms in the measuring object. With the aid of irradiated radio frequency waves, "ordered" or oriented nuclear spins can be excited to vibrate (resonance frequency). The vibration excites a radio frequency response signal, which is received with the aid of a receiving coil for subsequent analysis.

For the image reconstruction, exact information about the respective point of origin (location information) of the RF response signal is a mandatory prerequisite. This location information is obtained by additional magnetic fields (magnetic gradient fields) to the static magnetic field along the three spatial directions. The gradient fields are small compared to the main field and are formed by gradient coils.

FIG. 1 shows a front view of an MR system in a schematic representation. The main components are an annular basic field magnet 1 and a likewise annular gradient coil 2, which is located within the inner circumference of the basic field magnet 1. In this front view, besides the gradient coil 2, only an outer housing 3 of the basic field magnet 1 can be seen.

FIG. 2 shows an upper half of the cross-section through the magnetic resonance system indicated in FIG. 1. The basic field magnet of the magnetic resonance system has superconducting coils 4, which are arranged for cooling in a closed container, which is also referred to in the present document as a helium vessel or inner housing 5, with, for example, liquid helium.

The helium vessel or the inner housing 5 is surrounded by a further container, which is also referred to as an outer housing 3 here. This outer housing can be, for example, designed to be kettle-shaped and made of stainless steel. It is often also referred to as the "outer vacuum chamber" (OVC).

A vacuum usually prevails between the outer housing 3 and the inner housing 5, usually filled with liquid helium, which is typically at a temperature of 4K. In addition, arranged in many cases between the outer housing 3 and the inner housing 5 filled with liquid helium is (at least) one so-called cryoshield or cold shield, which is also referred to as an intermediate housing 6 here. It is used to reduce heat radiation between outer housing 3 and inner housing 5. On the other hand, in the case of an outer housing 3 made of electrically conductive material the effects of gradient coils stray fields on the "cryoshield" or intermediate housing 6 are reduced due to the conductivity.

By means of supporting elements, which are not shown in FIG. 2, the annular or cylindrical gradient coil 2 is concentrically inserted in the interior of the basic field magnet 1. Here, the gradient coil 2 is for example fixed on a support tube, which for the sake of an overview is also not shown in FIG. 2. A central axis 7 of the system constitutes its axis of rotational symmetry. A patient to be examined is placed, for example, on this central axis 7.

During operation of the gradient coil 2, the housing 3, 5, 6 of the magnet device, in other words the basic field magnet 1, is exposed to a stray field that changes over time. As a result, eddy currents are induced in the conductive layers of the housing 3, 5, 6, which in turn cause the stray field to be transported in the direction of the helium vessel or inner housing 5, in other words in the direction of the superconducting coils 4. The eddy current induced in this helium vessel or in the conductive structures such as superconducting coils 4 is converted on the one hand into ohmic heat, which in turn can lead to heating and evaporation of the liquid helium. On the other hand, a correspondingly strong stray field can also be transported in the direction of the superconducting magnet coils and lead to the quench of the magnet (transition from the superconductive to the normal conductive state). These illustrated transport processes of the stray field of the gradient coil in the direction of helium vessel 5 or magnet coils 4 is inflated if the stray field meets mechanical resonances of the shields or individual housing 3, 5, 6 of the magnet device 1 (basic field magnet). In principle, the problem is exacerbated with higher basic field strengths. Since ohmic heat is an energy value, it is proportional to the square of the corresponding field size. The connection between the vortex field at the location of the magnet coils and the movement of the outer housing 3 is in turn linear.

Until now, high helium consumption has been partly accepted as a necessary evil. As far as the problem was known, targeted modification of the MR measurement sequences was used to try and minimize the evaporation. The problem of field input into magnet coils and a quench induced thereby is still unresolved. In particular, up to now, no sensor system has been known whose measured values could safely protect a magnet from excessive energy input. Temperature sensors (as a function of placement) and special pressure sensors have relatively long time constants, whereas a quench can be triggered very quickly, for example, by local overheating.

SUMMARY

An object of the present disclosure is therefore to be able to monitor a magnetic resonance system easily and reliably and in particular to prevent overheating of components of a superconducting magnet device of a magnetic resonance system more reliably.

This object is inventively achieved by a method and by a magnetic resonance system respectively according to the claims.

A method is therefore provided for monitoring an operating parameter for a magnetic resonance system, wherein an electrically conductive structure is located in an outer housing, by determining a value of a vibration amplitude of the outer housing or an intermediate housing located in the outer housing at a vibration frequency, providing a transmission ratio between the vibration amplitude and the operating parameter at the vibration frequency and determining a value of the operating parameter as a function of the determined value of the vibration amplitude by means of the transmission ratio.

Therefore, an operating parameter for a magnetic resonance system is monitored, in particular for a magnet device of the magnetic resonance system. The magnet device is a device that includes the basic field magnets for the magnetic resonance system such as superconducting coils and, optionally, associated components such as liquid helium. The operating parameter relates to the operation of the magnet device, optionally directly or indirectly. The magnet device can be located in a multi-layered housing system which has at least one outer housing and one inner housing, possibly also one or more intermediate housing(s). The two or more individual housings are located one inside the other. In any case, there is a conductive structure in the outer housing, which can be the magnet device or the inner housing. As part of the method, firstly a vibration is measured, in other words a vibration value of the vibration of the outer housing or an intermediate housing. The outer housing is easily accessible and the intermediate housing is at least more easily accessible than the inner housing.

In one method step, a value of a vibration amplitude of the outer housing or an intermediate housing located between the inner housing and the outer housing at a vibration frequency is determined. Optionally, a plurality of vibration amplitudes is also measured, in particular at different locations of the respective housing.

As a further method step, a transmission ratio between the vibration amplitude and the operating parameter at the vibration frequency is provided. As a rule, a gradient coil is controlled with pulses, whereby optionally as a function of the location, a respective vibration spectrum is adjusted on the outer housing and/or the intermediate housing. One or more time signal(s) of such complex vibrations can then be measured for the magnetic resonance system, as well as the corresponding operating parameters (for example the energy input with this vibration into the inner housing or generally into the electrically conductive structure). From these variables, for example measured before the operation of the magnetic resonance system, the transmission ratio between the vibration and the operating parameter can now be determined. Optionally, the transmission ratio does not have to be individually determined for a magnetic resonance system. Rather, a transmission ratio can also be predetermined for a type of magnetic resonance system. In this case it is sufficient for the transmission ratio to be provided in a memory, for example, without it having been determined individually.

In a final method step, a value of the operating parameter is determined by means of the transmission ratio as a function of the determined value of the vibration amplitude. As a rule, the vibration amplitude value is multiplied by the transmission ratio at the respective frequency. A value of the operating parameter results as a product, for example a value for the energy input into the conductive structure, in particular into the inner housing or into a superconducting coil. Advantageously, it is therefore not necessary to measure the operating parameter directly itself, but it is possible to determine the operating parameter indirectly via a vibration of the outer housing or the intermediate housing. This can occur with a sensor system which is more easily accessible or interchangeable.

In a preferred embodiment the value of the vibration amplitude is determined as part of determining a vibration spectrum over a plurality of vibration frequencies, the transmission ratio is provided as part of providing a transmission function of the operating parameter over the vibration frequency and the value of the operating parameter is determined as a function of the determined vibration spectrum by means of the transmission function. Therefore a vibration amplitude and a transmission ratio are not selectively determined over a single vibration frequency, but rather a vibration spectrum and a corresponding transmission function over a particular spectral range of vibration frequencies. In other words, as a function of the vibration frequency, a large number of transmission ratios are obtained, which together result in the transmission function. Therefore a large number of spectral components can be determined, for example for the energy input into the helium vessel, and these spectral fractions can be totaled to give a total value of the operating parameter (for example total energy input).

For example, the conductive structure is a magnet device, in particular a superconducting coil, or an inner housing, and the operating parameter accordingly relates to a temperature of the inner housing, a pressure in the inner housing, an energy input into the inner housing or magnet device, or a variable dependent on it. The operating parameter can also indirectly affect one of these variables. By way of such a temperature value, pressure value, energy value or the like, the conditions in the inner housing can be well estimated, in particular with regard to a helium evaporation or a quench of the superconducting magnet coils. Depending on this, the magnet resonance system can be controlled accordingly.

In a preferred embodiment, providing the transmission ratio or the transmission function can involve the operating parameter being measured or simulated at the respective vibration frequency before commissioning of the magnetic resonance system. This means that before the actual operation of the magnetic resonance system, the operating parameter, for example the temperature in the inner housing, together with the vibration of the outer housing or intermediate housing is measured at one or at different vibration frequencies. This results in a characteristic relationship between the vibrations and the operating parameter, which characterizes the state inside the magnetic resonance system. The respective vibration amplitude is detected, for example, with a vibration sensor. In another alternative for providing the transmission ratio or the transmission function, the relationship between the vibration and the operating parameter is simulated as a function of the frequency. This requires more detailed information about the physical relationships within the magnetic resonance system. However, the simulation avoids complex measurements.

In one embodiment of the inventive method the transmission functions is non-linear with respect to the vibration frequency. In particular, the transmission function is not constant with respect to the vibration frequency. There is therefore no direct linear relationship between vibration amplitude and target variable, such as energy input, etc. Rather, the transmission function depends on the specific system design, the materials used and other status variables of the system. The transmission function cannot therefore be easily inferred from the frequency. Rather, complex measurements or simulations are necessary for this.

In addition, it can be provided that a signal of the vibration in the time range is measured and is transformed into the frequency range to determine the vibration spectrum. Therefore, a vibration signal that varies over time is measured for example by a vibration sensor. This time signal can be transformed into a frequency signal in particular with an FFT (Fast Fourier Transform). The respective vibration amplitude in each frequency band is obtained with the resulting vibration spectrum.

According to a further embodiment it is provided that the determined value of the operating parameter is compared with a threshold value, and the magnetic resonance system is switched off as a function of the resulting comparative result. The desired value of the operating parameter is therefore firstly determined here on the basis of the vibration frequency and the transmission ratio or on the basis of the vibration spectrum and the transmission function. If this value now exceeds a predetermined threshold value, this is a sign of a critical state of the magnetic resonance system.

Therefore, a corresponding comparison with the threshold value can be used to switch off the magnetic resonance system.

The above-mentioned object is also inventively achieved by a magnetic resonance system having
an outer housing,
an electrically conductive structure within the outer housing and
a gradient coil outside the outer housing,
and comprising
a sensor device to determine a value of a vibration amplitude of the outer housing or an intermediate housing located in the outer housing at a vibration frequency and
a monitoring device to provide a transmission ratio between the vibration amplitude and the operating parameter at the vibration frequency and to determine a value of the operating parameter as a function of the determined value of the vibration amplitude by means of the transmission ratio.

The sensor device can have one or more sensor(s). In particular, acceleration values can be measured at the outer housing and/or the intermediate housing. The sensor device can also have means for preprocessing sensor signals.

The electrically conductive structure can include an inner housing and/or a magnet device, in particular one or more superconducting coil(s) and optionally cooling material, which is filled for example in the inner housing or a pipe system. The magnet device optionally also includes controls for controlling the electrical (superconducting) magnets.

The monitoring device can have a processor and, in particular, a microprocessor for data processing. It can also have storage elements for storing data. In particular, a transmission ratio, or a transmission function, can be stored in the memory elements.

Further design possibilities and advantages of the magnetic resonance system result analogously to the above-described variation possibilities of the method for monitoring an operating parameter for the magnetic resonance system.

Arranged between the outer housing and the inner housing of the magnetic resonance system can be not only an intermediate housing, but at least one further intermediate housing. Intermediate housings of this kind preferably serve as cold shields or cryoshields. A plurality of such cryoshields have the advantage that the heat radiation can accordingly be kept away from the inner housing better.

Furthermore, it can be provided that the sensor device has at least two sensors, which are arranged between the gradient coils and the outer housing or directly on the gradient coils. In this way it can be ensured that the vibrations caused by the gradient field can be detected more accurately. If there is enough space between the gradient coil and the outer housing, the sensors can be arranged in-between. If this is not the case, the sensors can also be arranged at the axial edge of the gradient coils.

The outer housing can constitute an outer vacuum chamber. This means that there is vacuum inside the outer housing. In particular, the vacuum can prevail between the outer housing and the inner housing. Therefore heat convection can be effectively prevented.

As already indicated above, the intermediate housing and/or the further intermediate housing can provide a cold shield. The heat radiation between inner housing and outer housing can also be prevented with the aid of this intermediate housing or cold shields.

The electrically conductive structure can have an inner housing and/or a magnet device. The inner housing of the magnetic resonance system can in turn be a helium chamber or a pipe system. The magnet device for its part can have one or more superconducting coil(s). Specifically, liquid helium for cooling superconducting coils of the magnet device to about 4K can be found in the helium chamber. For other superconductors, the inner housing can also be filled with another coolant. If the inner housing is formed as a pipe system, pipes of the pipe system can run along the superconducting coils, in other words on them. The pipe system can have a single pipe or a plurality of pipes. The pipe(s) then conduct the coolant to cool the adjoining or adjacent superconducting coils.

In a specific design of the magnetic resonance system the vibration of the intermediate or outer housing is permanently coupled magneto-mechanically with a vibration of the inner housing. This coupling is therefore not purely mechanical, but due to magneto-mechanical interaction. With such a permanent coupling, the vibration of the inner housing can be directly inferred from the vibration of the outer housing. Therefore the energy input into the inner housing or into the electrically conductive structure can be inferred directly from the vibration of the outer housing.

In general, the vibration of the intermediate housing or outer housing can be coupled to a vibration of the inner housing or the electrically conductive structure according to the transmission ratio or the transmission function. In other words, the coupling between inner housing or electrically conductive structure and external housing influences the transmission ratio or the transmission function.

The above-described properties, features and advantages of this disclosure as well as the way in which it is achieved will become clearer and more comprehensible in conjunction with the following description of the exemplary embodiments which are discussed in more detail in connection with the drawings. The disclosure is not limited to these exemplary embodiments by this description. Identical components are provided with identical reference numerals in different figures. As a rule, the figures are not to scale.

BRIEF DESCRIPTION OF THE DRAWINGS

In the drawings:

FIG. 7 shows housing layers in the case of complete coupling;

FIG. 8 shows housing layers in the case of loose coupling;

FIG. 13 shows an exemplary, schematic procedure.

DETAILED DESCRIPTION

Figure 1:
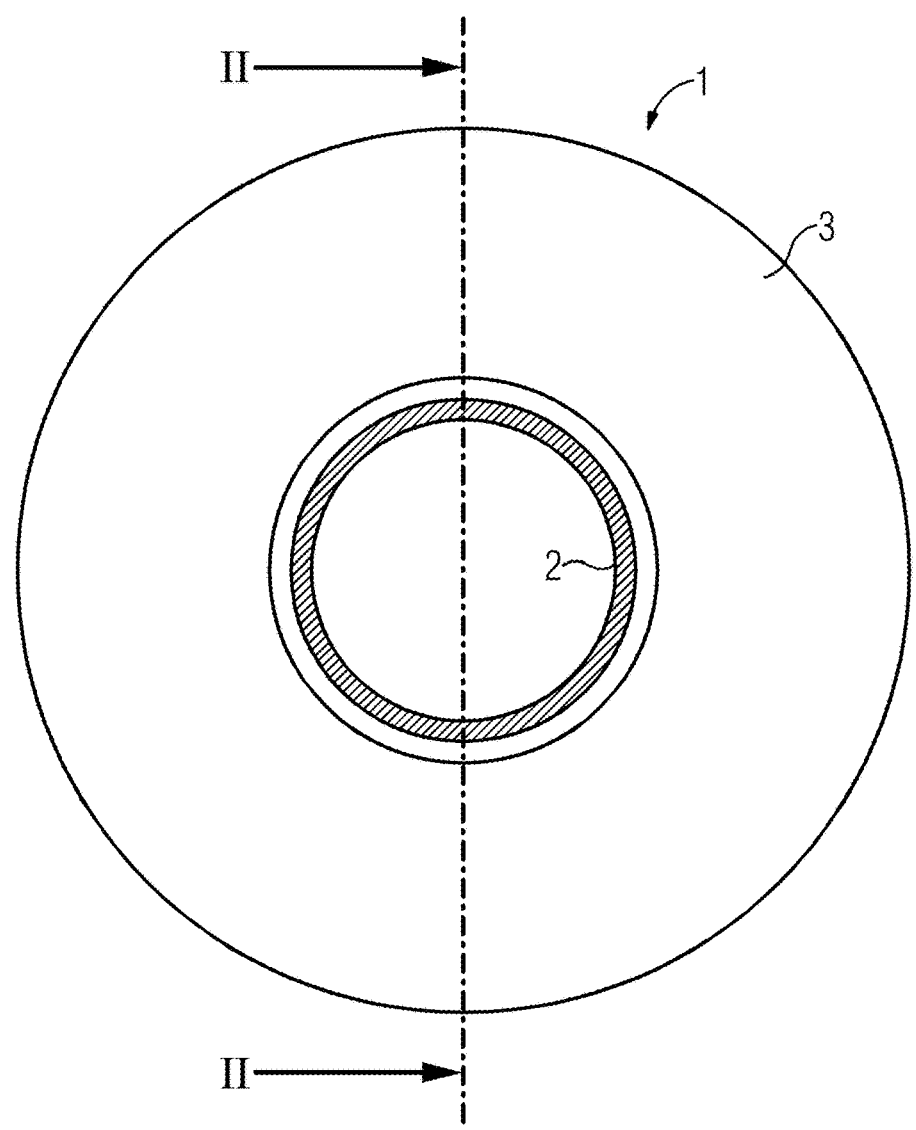
FIG. 1 shows a schematic front view of a magnetic resonance system.

The exemplary embodiments described in more detail below represent preferred embodiments of the present disclosure.

As already mentioned in the introduction, when operating a gradient coil 2 (compare FIG. 2) of a magnetic resonance system, the housing 3, 5, 6 of the magnet is exposed to a stray field that varies over time. This induces eddy currents in the conductive layers of the magnet housing, which in turn cause the stray field to be transported in the direction of the helium vessel or a corresponding pipe system, in other words the inner housing 5, or in the direction of the magnet coils 4 (hereinafter usually only the inner housing 5 or the magnet coils will be referred to as representative of electrically conductive structures in the outer housing 3, but they can also be other cable sections, connections, fittings or the like). The eddy current induced in this helium vessel (hereinafter this term will often be used as representative of the inner housing 5 or also pipe system) or in the other conductive structures such as magnet coils 4, 4K shield (hereinafter used as representative of the term intermediate housing 6), etc. is converted firstly into ohmic heat, which in turn can lead to heating and evaporation of the liquid helium. Secondly, a correspondingly strong stray field can also be transported in the direction of the superconducting magnet coils 4 and lead to the quench of the magnet. These transport processes of the stray field of the gradient coil 2 in the direction of helium vessel 5 or magnet coils 4 are inflated if the stray field meets mechanical resonances of the shields or individual housings 3, 5, 6 in the magnet housing. In principle, the problem is exacerbated with higher basic field strengths. Since ohmic heat is an energy value, it is proportional to the square of the field variables. The relationship between the vortex field at the location of the magnet coils and the movement of the OVC 3 ("outer vacuum chamber", hereinafter also used as representative of the term outer housing 3) is, as a rule, linear.

In order to minimize helium consumption, only targeted modifications of the MR measuring sequences could be made up to now. In exceptional cases, a field input into the magnet coils and a quench of the magnet induced by this could hardly be controlled. A sensor system that is able to quickly detect for example local overheating is not known.

Since both the cold shield(s) 6 and the helium vessel 5 are difficult to access due to the cryogenics, it is difficult to measure the vibration or the introduced heat in these structures directly during imaging by the magnetic resonance system. Since the outer housing 3 of the magnet (in other words the OVC) is usually also conductive, this structure also participates in said transport of the field in the direction of helium vessel 5. Based on this finding, it is therefore inventively proposed to measure the vibrations of the OVC 3 in order to determine the energy input in the helium vessel 5. For this purpose, vibration sensors should be provided at clearly defined positions (in particular positions that take into account the symmetry of the gradient field and therefore also the stray field of the gradient coil) in what is known as the "inner bore", in other words the inner circumference or the inner side of the annular outer housing and on the ends of the OVC 3 (compare FIGS. 9 and 10). Instead of the energy input into the inner housing, for example another operating parameter, namely a temperature of the inner housing, a pressure in the inner housing or a variable dependent thereon can be indirectly determined by the vibration of the OVC 3 or a cold shield 6.

The relationship between this critical operating parameter and the vibration of the OVC or outer housing 3 is based on knowledge which is briefly explained in connection with FIGS. 3 to 8. In particular, this explains the transport of the fields or the energy through the housing layers.

Figure 2:
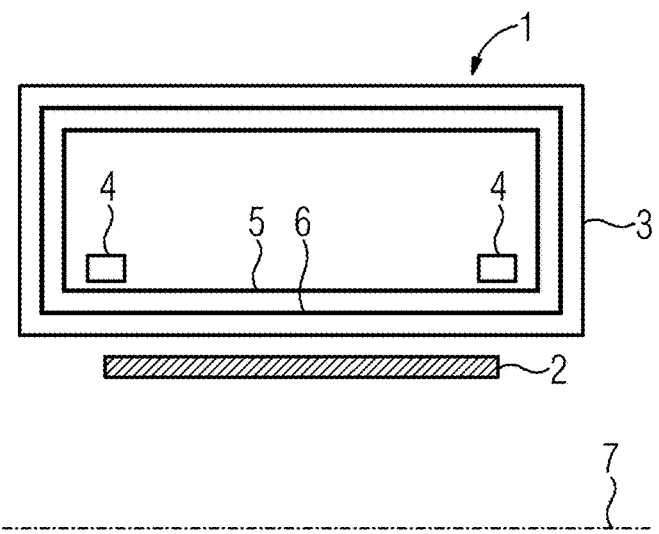
FIG. 2 shows a partial cross-section through the magnetic resonance system of FIG. 1.
Figure 3:
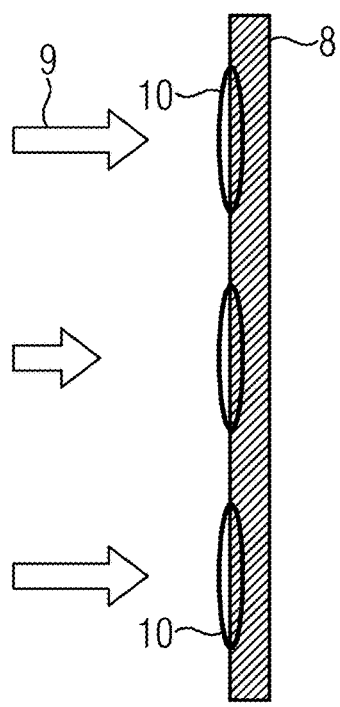
FIG. 3 shows a schematic diagram on the formation of primary eddy currents.

FIG. 3 shows a housing wall 8, which can be part of the outer housing 3, inner housing 5 or an intermediate housing 6 of the magnetic resonance system (compare FIG. 2). A dynamic stray field 9 of the gradient coil 2 acts in particular perpendicularly onto the conductive wall 8. This induces primary eddy currents 10 in the conductive wall 8.

Figure 4:
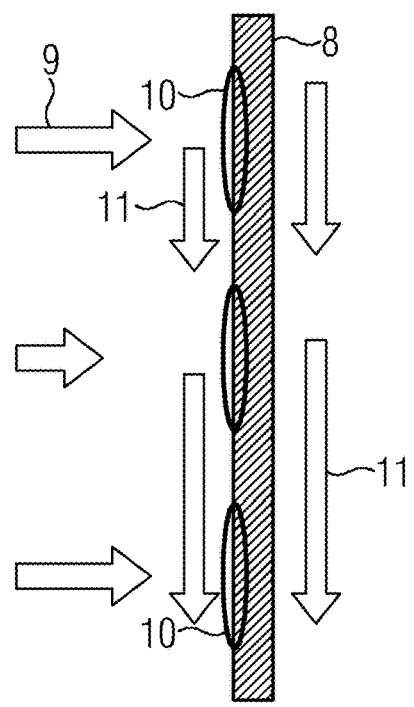
FIG. 4 shows a schematic diagram on the influence of the magnetic basic field.
Figure 5:
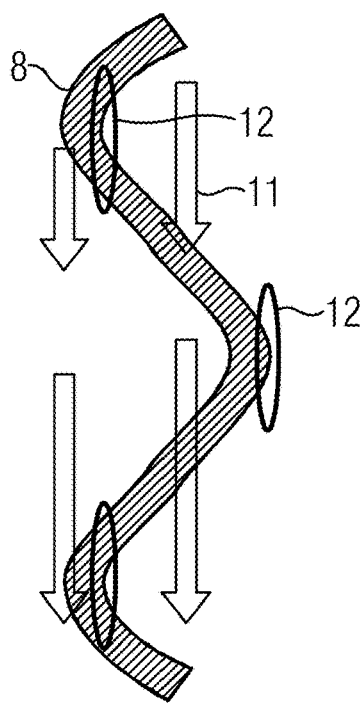
FIG. 5 shows a schematic diagram on the formation of secondary eddy currents.
Figure 6:
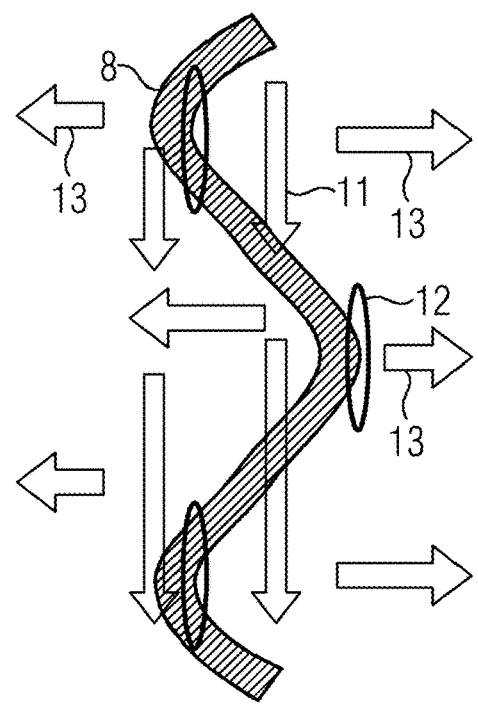
FIG. 6 shows a schematic diagram on the formation of secondary fields.

In addition, according to FIG. 4 the basic field or Bo field 11 acts parallel to the wall and substantially perpendicularly to the dynamic stray field 9. Due to the resulting Lorenz forces the wall 8 is deflected and vibrates as a function of the dynamics of the gradient field or stray field 9. This is outlined in FIG. 5, where for the sake of clarity the stray field 9 is no longer shown. Secondary eddy currents 12 are produced due to these vibrations of the wall 8. According to FIG. 6 these in turn provide for secondary fields 13 perpendicular to the Bo field 11. These secondary fields 13 also act on the adjacent housing respectively and also excite these to corresponding vibrations. Therefore fields can be transported through the individual conductive housings. Consequently, corresponding eddy currents are also produced in the inner housing, which is filled with helium, for example. Similarly, the fields can continue up to the magnet coils and also cause corresponding eddy currents there. The above-described energy inputs with the corresponding consequences are the result.

FIG. 7 shows a section through a part of a four-walled magnet housing, for example in the region of the inner bore. The individual housings from the outside to the inside are: the outer housing 3, a first intermediate housing 6, a second intermediate housing 6' and the inner housing 5. It can be seen In FIG. 7 that all individual housings 3, 6, 6' and 5 vibrate uniformly or synchronously. So if the outer housing 3 has an antinode outwards, then the intermediate housings 6 and 6' and the inner housing 5 also have an antinode outwards at the corresponding location. The same applies to the other vibration phases. In this case there is therefore a fixed or complete coupling between the individual housings. There is a clear correlation between the external and internal vibrations.

By contrast, FIG. 8 shows a case in which there is no complete coupling between the individual housings. At this point it should be emphasized that the drawing is not to scale and in particular the distance between the individual housings has also been shown reduced in size in order to be able to recognize the effect better. In particular, it is shown that the vibrations of the individual housings are at least partially completely uncorrelated. In other words, the outer housing 3 vibrates differently than the inner housing 5. Therefore while in the system of FIG. 7 the vibration of the inner housing 5 can be inferred directly from the vibration of the outer housing 3, this is not possible with the system of FIG. 8. Rather, there it is to be assumed that the coupling between outer housing 3 and inner housing 5 may be described by a rather complex transmission function.

Figure 9:
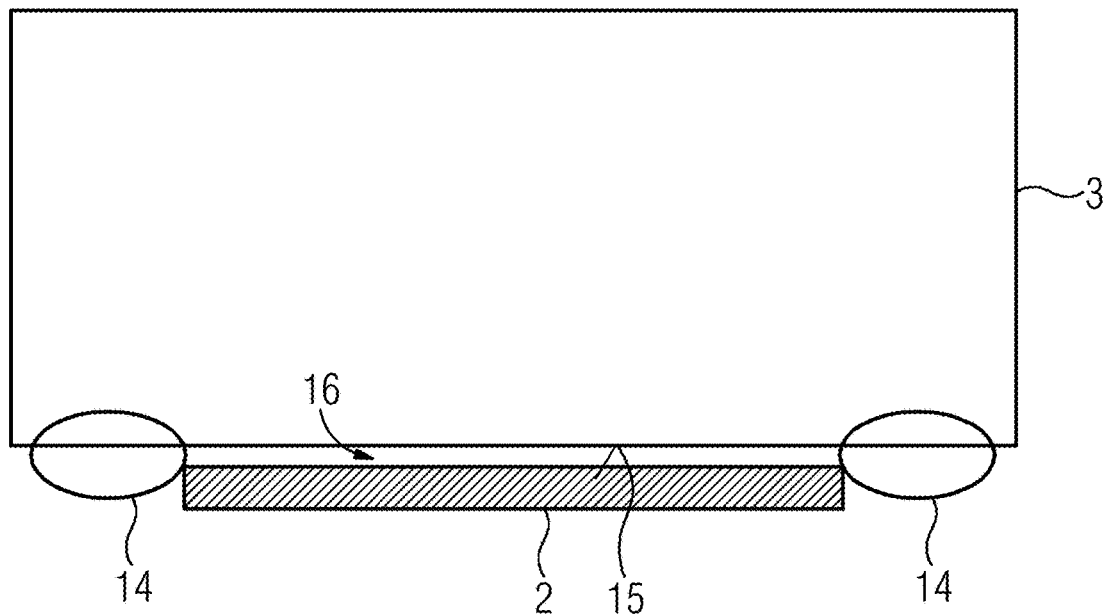
FIG. 9 shows an arrangement of vibration sensors with a small gap between the outer housing and gradient coil.

In order to be able to absorb the vibrations of the outer housing 3, appropriate vibration sensors 14 are to be arranged, for example, on the outer housing 3, as FIG. 9 shows for example. In contrast to FIG. 2, the components inside the outer housing 3 are not shown for the sake of simplicity. The annular outer housing 3 has an inner side 15, which can also be referred to as an inner bore or inner circumference. Only a narrow gap 16 is provided here between the inner side 15 and the gradient coil 2. This gap 16 is not sufficient here to arrange the vibration sensors 14 between the inner side 15 and the gradient coil 2. Therefore, the vibration sensors 14 are attached laterally next to the gradient coil 2, placed as close as possible to it, on the outer housing 3. The vibration sensors 14 then pick up the vibrations of housing sections which are not exactly affected by a radial stray field, but due to the close proximity to the gradient coil, their effects are still easy to detect. In particular, the vibrations of the outer housing 3 in the axial direction also propagate laterally from the gradient coil. Even with vibration sensors placed slightly apart in this way it is possible to make meaningful estimates of the energy input in the helium vessel 5.

Figure 10:
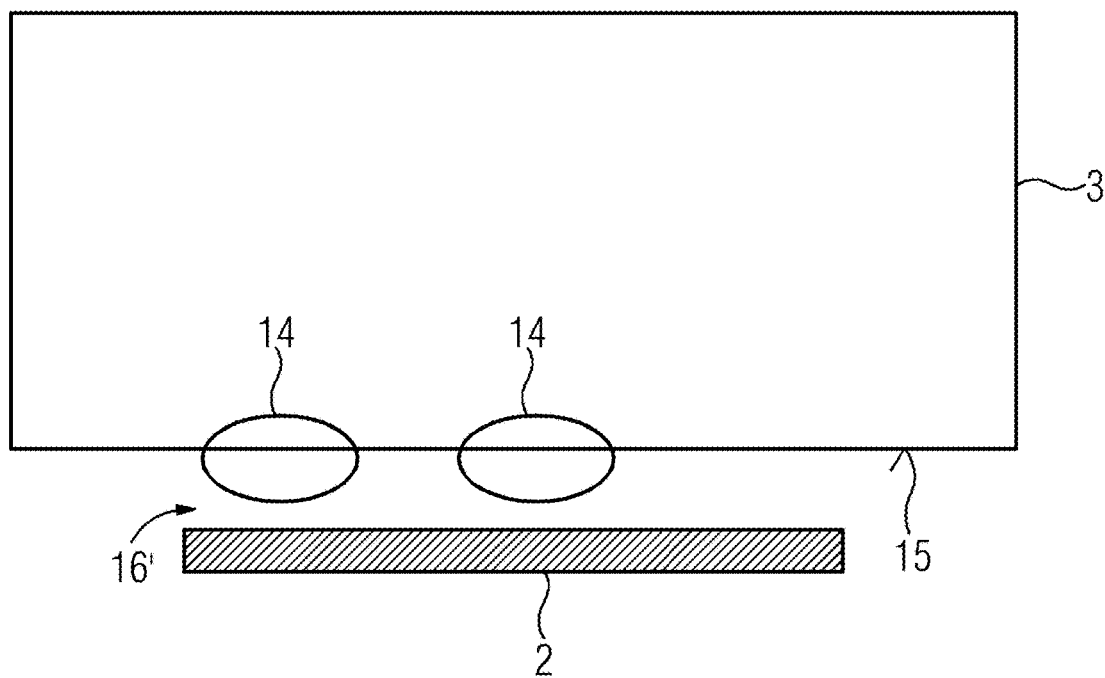
FIG. 10 shows an arrangement of vibration sensors with a larger gap between outer housing and gradient coil.

In a different construction of the magnetic resonance system according to FIG. 10 there is sufficient distance 16' between the inner side 15 and the gradient coil 2. In this case, the vibration sensors 14 can be placed directly in the gap 16'. Since, as a rule, the gradient field and therefore also the stray field of the gradient coil 2 are symmetrical, it is usually sufficient to fit a fraction of the surface of the outer housing 3 or intermediate housing 6 affected by the vibrations with vibration sensors 14. For example, it is sufficient to analyze a quarter or an eighth of the vibrating surface of the outer housing 3 with the oscillation sensors or vibration sensors in order to be able to reliably estimate the total input of energy into the helium vessel 5. In the schematic drawings of FIG. 9 and FIG. 10, however, it should be noted that the drawn symbols for the vibration sensors 14 only represent possible locations for the vibration sensors. For example, 50 sensors or any other number can be arranged distributed on the inner side 15 of the outer housing 3 in order to be able to accordingly pick up the vibrations locally accurately as well.

The critical variable, which can lead to helium evaporation or quench, is also generally referred to in this document as the operating parameter. As already mentioned above, this can be the temperature of the inner housing, the pressure in the inner housing, the energy input into the inner housing or a corresponding variable. Hereinafter, the energy input is usually referred to as a representative of other operating parameters.

Since the vibrations of the OVC 3 do not directly match the sought problematic variable (in other words the energy input in the critical region of the magnet, for example in the helium vessel 5), the dependence of the sought variable (energy in the helium vessel 5 or in the 4K structure 6) on the measured variable (vibrations of the OVC 3) must firstly be determined. Therefore a transmission function should be formed between the measured vibrations and the energy input in the helium vessel 5. For simplified estimates, it can also be sufficient to form only one transmission ratio at a particular, distinctive vibration frequency instead of a transmission function over the vibration frequency. Sometimes it is sufficient, for example, for a rough estimate to determine only the vibrations at 2,000 Hz and the transmission factor there or to determine the transmission ration there in order to estimate the total energy input at the respective instant. However, it is much more accurate to spectrally determine an exact transmission function 17 over all vibration frequencies f (compare FIG. 11) and likewise a corresponding vibration spectrum 18 (compare FIG. 12) in order to determine the respective energy input for each frequency band. The energy input integrated over all frequency bands then gives the sought variable of the total energy input or the value of the critical variable.

Figure 11:
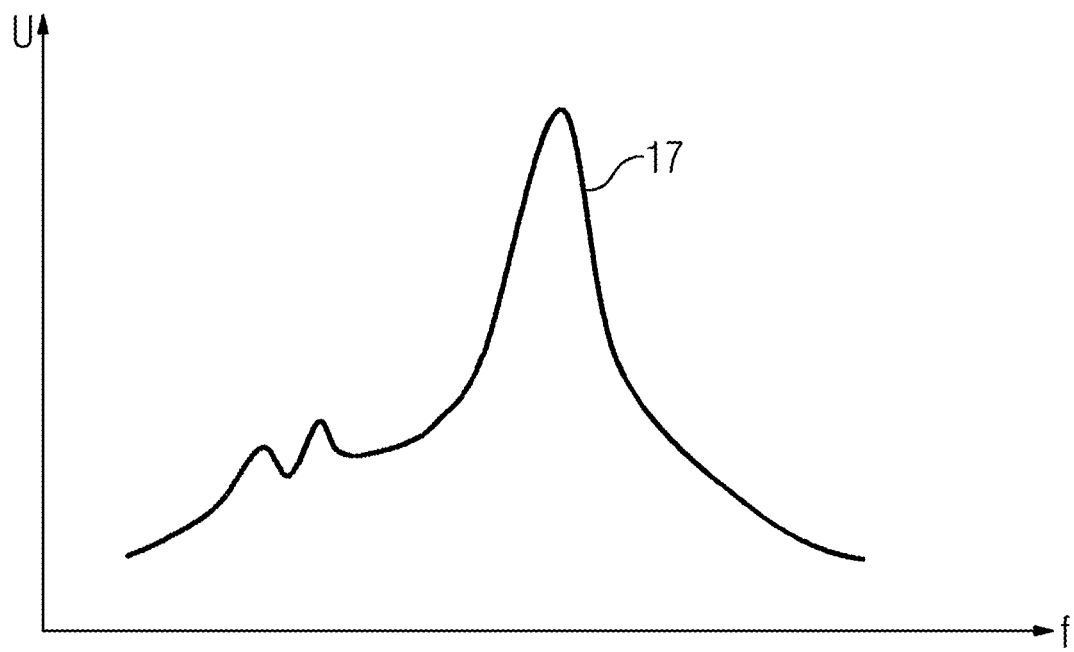
FIG. 11 shows a schematic transmission function.

For the determination of the transmission function 17 according to FIG. 11, for example, the energy in the helium vessel 5 (or in the critical regions such as magnet coils, 4K shield 6) is measured as a function of the excitation frequency or vibration frequency f. For this purpose, for example a measured value is determined individually for each frequency band. For example, a transmission function 17 as shown in FIG. 11 results, which has a clear maximum. For example, this maximum can be 2,000 Hz due to the system.

Since the process of field or energy transport starting from the stray field of the gradient coil to the magnet interior depends only on the construction of the system, in other words the geometry of the magnet and the gradient coil, the conductivity of the installed materials, the stray field of the gradient coil and the magnetic field of the main magnet, it is sufficient to carry out this measurement once. Therefore, it is not necessary to ensure that the MR system meets all the requirements necessary for MR imaging during this measurement. In other words, for the precise and, possibly lengthy, recording of the transmission function 17, which shows the respective frequency-dependent transmission ratio, measurement methods can be used which are either too complex to run during normal operation, or which modify the system in such a way that normal imaging is not possible to a limited extent. In particular, numerous thermal sensors with a corresponding number of cables, but also currented Hall sensors can be used therefore, which would not only cause image disturbances, but also a correspondingly high energy input.

The measured variable for determining the input energy is then, for example, the heat in the helium vessel 5, the evaporated helium, the pressure change in the helium vessel or a correspondingly different variable. If both the appropriate characteristic for the energy input in the helium vessel 5 (for example evaporated helium), as well as the respective vibration frequency f of the OVC 3 is now measured, the transmission function 17 according to FIG. 11 can be generated from the two variables. Therefore, a value of the energy input in the helium vessel 5 can be specified especially at a particular frequency of the gradient signal for a value of the OVC vibration amplitude. This transmission function is stored for the system.

If such a measurement is not possible, or if a transmission function for a similar type of MR system is to be determined, the transmission function could also be determined with aid of a simulation. In such a simulation, the complete process (transport of the field from the gradient coil to the magnet interior via a coupling of magnetic fields and mechanical movements) would have to be calculated in the relevant frequency range.

Figure 12:
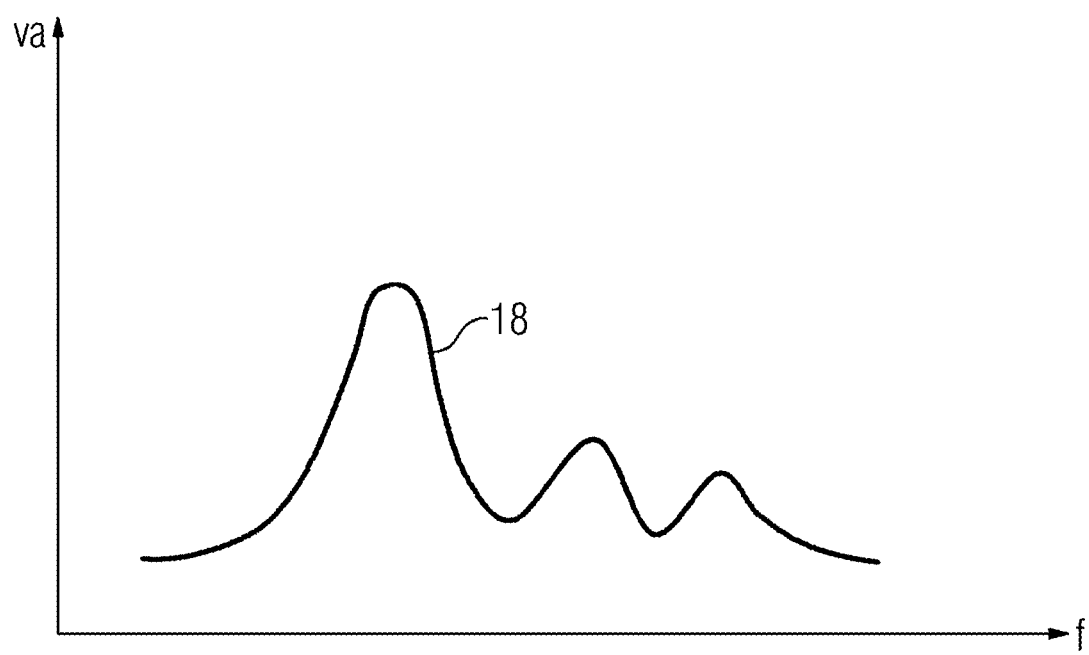
FIG. 12 shows a vibration spectrum.

During normal operation of the MR system, it is sufficient to measure only the vibrations of the OVC 3. For example, a vibration spectrum according to FIG. 12 is obtained from the obtained time signals by means of an FFT, and this shows the vibration amplitude va over the frequency. For each frequency band, the vibration amplitude va can then be multiplied by the respective transmission ratio u of the transmission function 17 in order to determine the respective energy input per frequency band. The sum over all frequency bands then gives the total energy input or the desired value of the operating parameter.

It should be noted that the vibrations and the field input on the magnet coils scale linearly with the stray field, while the energy input scales quadratically with the field. This means that in order to determine the influence on the energy input into the helium vessel 5, the vibration amplitude must be squared.

With high-field systems, in other words at field strengths of 7 T and more, a vibration spectrum 18 of the OVC 3 has strong similarities with the spectrum of the energy input in the helium vessel 5 due to the magnetic couplings. With a fully coupled state (compare FIG. 7), the amplitude of the vibration measured value can be used directly as a characteristic as a function of the hardware configuration and the frequency range.

For small systems, by contrast, in other words at lower field strengths (1.5 T and smaller), large differences between the measured value and the energy input are to be expected (compare FIG. 8). However, since the system is a deterministic system, such a transmission function can be determined even at lower basic field strengths. Finally, the vibration spectrum serves here as a measure of the stray field of the individual gradient coil.

Values determined from the vibration could be used for switching off the MR systems if the determined value exceeds a threshold value. The particular advantage of a vibration sensor, namely the fast reaction, can be exploited in this case. Therefore a high energy input can be detected very quickly with the vibration sensors and corresponding switching-off of the system can be triggered. The vibration amplitude is a distinctive variable of the energy transport. At least with fully coupled systems, the amplitude of an increasing resonance represents the energy deposition in real time. With such a sensor system based on vibration measurement, the safety margin for the protection of the magnet could therefore be kept quite small and therefore significantly more useful performance made available to the applications.

In principle, as already indicated above, a transmission function 17 (in other words the transmission of the (stray) field of the gradient coil to the energy input or field input in the helium vessel or the magnet structures) could also be determined by means of simulation or measurement once on a prototype or vibration sensor. The input of the gradient signal (for example the currents of the GPA signal) could be used in order to monitor the influence of the (stray) field of the gradient coil on the field input or energy input of the MR system. However, the influence of the individual gradient coil (in other words changes in the stray field due to structural tolerances) would not be taken into account in this way. However, if the gradient coils are designed in such a way that the stray field is small, then the change in the stray field due to the construction shall be at least in the order of the absolute size of the individual stray field maxima.

Another possibility (which takes into account the individual influences of the construction of the gradient coil) would be, as mentioned, to measure the vibrations not on the OVC 3, but on the cold shield 6. Since the transport process is determined in equal part by the dynamics of the cold shield 6, the transmission function thus determined would be closer to the desired variable. However, if the vibrations of the OVC 3 are measured, replacing defective sensors is significantly easier than when the vibration of the cold shield 6 is measured. In order to determine such a defect, a QA step could be defined, which checks the functionality of the sensors (in other words response of the sensors to a particular gradient signal). If this QA step fails, a service technician would have to replace the sensor or sensors.

FIG. 13 shows a schematic exemplary embodiment of an inventive method for monitoring an operating parameter (in particular an energy input) for a magnet device of a magnetic resonance system, with the magnet device being located in an outer housing and an inner housing located therein. In one step S1, a value of a vibration amplitude of the outer housing or an intermediate housing located between the inner housing and the outer housing is determined at a vibration frequency. Alternatively, an overall vibration spectrum is determined.

In a step S2, which can be occur before or after step S1, a transmission ratio between the vibration amplitude and the operating parameter at the vibration frequency is provided. Again alternatively, an overall transmission function is provided for a larger frequency range.

In a subsequent step S3 a value of the operating parameter is determined as a function of the determined value of the vibration amplitude by means of the transmission ratio. In the alternative embodiment, this value of the operating parameter is determined on the basis of the vibration spectrum and the transmission function.

Finally, in a step S4 the MR system can be switched off as a function of the determined value of the operating parameter. In particular, a switch-off can take place if the energy input, caused by the vibrations, into the inner housing exceeds a predetermined threshold value.

The invention claimed is:

1. A method for monitoring an operating parameter for a magnetic resonance system, wherein an electrically conductive structure is located in an outer housing, the method comprising:
   determining a value of a vibration amplitude of the outer housing or an intermediate housing located in the outer housing at a vibration frequency;
   providing a transmission ratio between the vibration amplitude and the operating parameter at the vibration frequency; and
   determining a value of the operating parameter as a function of the determined value of the vibration amplitude using the transmission ratio.

2. The method as claimed in claim 1, wherein the value of the vibration amplitude is determined as part of determining a vibration spectrum over a plurality of vibration frequencies, the transmission ratio is provided as part of providing a transmission function of the operating parameter over the vibration frequency, and the value of the operating parameter is determined as a function of the determined vibration spectrum using the transmission function.

3. The method as claimed in claim 2, wherein providing the transmission ratio or the transmission function involves the respective value of the operating parameter being measured or simulated at the respective vibration frequency before commissioning of the magnetic resonance system.

4. The method as claimed in claim 2, wherein the transmission function is non-linear with respect to the vibration frequency.

5. The method as claimed in claim 2, further comprising:
   measuring a signal of the vibration in a time range; and
   transforming the signal of the vibration into the frequency range in order to determine the vibration spectrum.

6. The method as claimed in claim 2, further comprising:
   comparing the determined value of the operating parameter with a threshold value; and
   switching off the magnetic resonance system as a function of the comparison result.

7. The method as claimed in claim 1, wherein the conductive structure is a superconducting coil, or an inner housing and the operating parameter corresponding to a temperature of the inner housing, relates to a pressure in the inner housing, an energy input into the inner housing or into the magnet device, or a variable dependent thereon.

8. A magnetic resonance system having an outer housing, an electrically conductive structure within the outer housing, and a gradient coil arranged outside the outer housing, wherein the magnetic resonance system comprises:

a sensor configured to determine a value of a vibration amplitude of the outer housing or an intermediate housing located in the outer housing at a vibration frequency; and a monitor configured to provide a transmission ratio between the vibration amplitude and the operating parameter at the vibration frequency, and to determine a value of the operating parameter as a function of the determined value of the vibration amplitude using the transmission ratio.

9. The magnetic resonance system as claimed in claim 8, wherein at least one further intermediate housing is arranged in the intermediate housing.

10. The magnetic resonance system as claimed in claim 9, wherein the intermediate housing or the at least one further intermediate housing constitutes a cold shield.

11. The magnetic resonance system as claimed in claim 8, further comprising at least two sensors, which are arranged between the gradient coil and the outer housing or directly on the gradient coil.

12. The magnetic resonance system as claimed in claim 8, wherein the outer housing constitutes an outer vacuum chamber.

13. The magnetic resonance system as claimed in claim 8, wherein the conductive structure is an inner housing designed as a helium chamber, a pipe system, or a superconducting coil.

14. The magnetic resonance system as claimed in claim 13, wherein the vibration of the intermediate housing or the outer housing is permanently coupled magneto-mechanically to a vibration of the inner housing.

15. The magnetic resonance system as claimed in claim 14, wherein the vibration of the intermediate housing or the outer housing is coupled to a vibration of the inner housing according to the transmission ratio or a transmission function of the operating parameter over the vibration frequency.

* * * * *